(12) United States Patent  (10) Patent No.: US 9,031,116 B2
Young et al.  (45) Date of Patent: May 12, 2015

(54) MONITORING OF POWER-CONSUMPTION

(75) Inventors: Philip Young, Northampton (GB); Andrew James Heaton, Chepstow (GB)

(73) Assignee: enModus Limited, Monmouthshire (GB)

( * ) Notice: Subject to any disclaimer, the term of this patent is extended or adjusted under 35 U.S.C. 154(b) by 29 days.

(21) Appl. No.: 13/704,044

(22) PCT Filed: Jun. 27, 2011

(86) PCT No.: PCT/GB2011/051209
§ 371 (c)(1),
(2), (4) Date: Jan. 18, 2013

(87) PCT Pub. No.: WO2011/161476
PCT Pub. Date: Dec. 29, 2011

(65) Prior Publication Data
US 2013/0215933 A1  Aug. 22, 2013

(30) Foreign Application Priority Data
Jun. 25, 2010  (GB) .................................. 1010728.2

(51) Int. Cl.
H04B 1/00 (2006.01)
H04B 1/7075 (2011.01)
H04Q 9/00 (2006.01)
(Continued)

(52) U.S. Cl.
CPC ............... *H04B 1/7075* (2013.01); *H04Q 9/00* (2013.01); *G01R 21/006* (2013.01); *G06F 17/00* (2013.01); *H04Q 2209/10* (2013.01); *H04Q 2209/60* (2013.01); *H04Q 2209/43* (2013.01); *H04Q 2209/30* (2013.01)

(58) Field of Classification Search
CPC ... H04B 1/707; H04B 1/70735; H04B 1/7075
USPC ...................................... 375/145, 147; 702/62
See application file for complete search history.

(56) References Cited

U.S. PATENT DOCUMENTS 4,241,237 A  12/1980  Paraskevakos
4,644,320 A   2/1987  Carr et al.
(Continued)

FOREIGN PATENT DOCUMENTS

CN  201382973 Y  12/1997
CN    2362237 Y   1/2010
(Continued)

OTHER PUBLICATIONS

Electric Power (20008), vol. 41, Chen Xiao-juan et al., "Middle-voltage power line communication based on chaotic spread spectrum", pp. 69-73.

*Primary Examiner* — Kahi Tran
(74) *Attorney, Agent, or Firm* — Wood, Phillips, Katz, Clark & Mortimer

(57) ABSTRACT

A power-consumption monitoring device, for taking measurements of the power consumed by an appliance. The device is connectable to a mains electrical circuit and operable to transmit the measurements to a master device through the circuit. Also presented is a master device, for receiving over a mains electrical circuit power-measurements transmitted by one or more power-consumption monitoring devices. Also presented is a power-line communications network comprising: a master device; and one or more power-consumption monitoring devices.

14 Claims, 5 Drawing Sheets

(51) Int. Cl.
*G01R 21/00* (2006.01)
*G06F 17/00* (2006.01)

(56) References Cited

U.S. PATENT DOCUMENTS

| | | |
|---|---|---|
| 4,864,589 A | 9/1989 | Endo |
| 5,572,438 A | 11/1996 | Ehlers |
| 6,124,806 A | 9/2000 | Cunningham |
| 6,218,931 B1 | 4/2001 | Asghar |
| 7,460,930 B1 | 12/2008 | Howell |
| 7,868,562 B2 | 1/2011 | Salsbury |
| 2001/0010032 A1 | 7/2001 | Ehlers et al. |
| 2002/0075163 A1 | 6/2002 | Smith |
| 2002/0116139 A1 | 8/2002 | Przydatek et al. |
| 2002/0184157 A1 | 12/2002 | Pauschinger |
| 2007/0066311 A1* | 3/2007 | Reibel et al. .......... 455/445 |
| 2007/0070877 A1 | 3/2007 | Sun et al. |
| 2007/0282547 A1 | 12/2007 | Howell et al. |
| 2008/0136334 A1 | 6/2008 | Robinson et al. |
| 2008/0211230 A1 | 9/2008 | Gurin |
| 2009/0207753 A1 | 8/2009 | Bieganski |
| 2010/0156665 A1 | 6/2010 | Krzyzanowski et al. |
| 2010/0201193 A1 | 8/2010 | Ogura |
| 2010/0235144 A1 | 9/2010 | Mosberger et al. |
| 2010/0235159 A1 | 9/2010 | Sharma et al. |
| 2010/0280774 A1 | 11/2010 | Ewing |
| 2011/0082599 A1 | 4/2011 | Shinde et al. |

FOREIGN PATENT DOCUMENTS

| | | |
|---|---|---|
| EP | 2292986 A2 | 3/2011 |
| GB | 1086281 A | 1/1965 |
| JP | 10104277 A | 4/1998 |
| KR | 20010083853 A | 9/2001 |
| WO | 03/005599 A1 | 1/2003 |
| WO | 2008025939 A | 3/2008 |
| WO | 2010095121 A | 8/2010 |
| WO | 2011002735 A | 1/2011 |

* cited by examiner

MONITORING OF POWER-CONSUMPTION

This invention relates to methods and apparatus for monitoring the power-consumption of appliances. More particularly, it relates to a distributed arrangement of monitoring devices and an associated master device for aggregating measurements from the monitoring devices.

It is known to monitor the power consumption of individual electrical appliances, and to transmit power or energy measurements to a centralized monitoring station. Such systems can be used in residential or commercial premises, and allow the user to discover which devices are consuming power; how much power is being consumed; and when. It is also possible to deliver the measurements to the electricity supplier, for metering purposes or other analysis.

Most of the existing equipment for addressing the monitoring market uses wireless communication between the measurement devices and the central ("master") aggregator. However, it has also been proposed to use power-line communications for this purpose. For example, the Home-Plug Powerline Alliance has proposed that a communications protocol be standardised for smart grid/smart energy applications. This will use existing powerline communications technology, so that the specification will be a profile of the IEEE P1901 standard. This is a worldwide standard for the provision of broadband (high-speed) communications over power line networks.

The present inventors have recognised that wireless solutions will suffer from limited communications range, interference, and significant node cost. They have also recognised that a power-monitoring system based on existing high-speed power-line data communications technology is unnecessarily complex, because the measurements that will be transmitted are small in size and they can be transmitted relatively infrequently (for example, once per second). Consequently, the inventors have identified a need for a simpler and more economical power-line based system.

Accordingly, there is provided a device adapted to: receive a spread-spectrum timing-reference signal from another device; detect a code-phase of the received reference signal; and transmit data to the other device with a timing that is defined relative to the detected code-phase.

One advantageous use of this device is as a monitoring device in a power-consumption monitoring network, communicating over a power-line.

According to a first aspect of a first inventive concept, there is provided a power-consumption monitoring device, for taking measurements of the power consumed by an appliance, the device being connectable to a mains electrical circuit and operable to transmit the measurements to a master device through the circuit, wherein the device is adapted to:

receive a spread-spectrum timing-reference signal from the master device;

detect a code-phase of the received reference signal; and transmit the measurements to the master device with a timing that is defined relative to the detected code-phase.

One of the most significant sources of inefficiency when using conventional power-line technologies for this application is the overhead involved in setting up communication between the master, controller device and (potentially many) monitoring nodes. At the high data rates usually seen in broadband communications, the overhead is necessary to support complex applications; and also negligible compared with the total data bandwidth.

In the present system, a spread-spectrum timing reference signal is used to synchronise all the monitoring devices in the network to the clock of the master device. Individual devices can then transmit their measurements with specified timing, relative to this central reference. The spread-spectrum reference signal allows for very accurate timing recovery, while at the same time being robust to the type of interference encountered in the power-line environment. In powerline communications, the problem of fading (seen in RF communications) is usually minimal. Changes to the channel tend to be caused only by major changes in the wiring architecture, so that once a communications channel is established it will generally remain reliable. However mains-borne communications suffer from a larger interference source which is generally wideband and short duration, caused by switching of loads (impulse noise). Appliances such as cookers and coffee makers have been shown to be some of the worst culprits in a domestic environment, for producing this type of interference. Use of a spread-spectrum reference signal enables the monitoring network to be largely immune to this type of bursty, impulsive interference. Consequently, it is desirable to have a communications protocol which remains robust in the presence of short term wideband noise bursts.

Here, "spread-spectrum" refers to a signal that is modulated at least by a pseudo-random spreading-code (or "chipping code") sequence. These signals have been used for other purposes in other technical fields such as RF communications—for example, in applications like GPS satellite positioning and third generation mobile communications (e.g. CDMA). In the present application, the phase of the chipping-code can be recovered and used as a timing reference. In this way, all the devices in the network share the same timing and there is no need for complex timing recovery when data messages are sent, or complex arbitration between devices which may wish to transmit simultaneously. For example, once it has recovered the timing reference signal the monitoring device does not need to request permission to transmit.

As well as timing its transmissions in accordance with the timing of the reference signal, the monitoring device may adjust a frequency of its internal clock or local oscillator to better match a frequency of the spread-spectrum reference signal.

Preferably, the spread-spectrum reference signal is periodically modulated by a synchronisation symbol, the monitoring device being adapted to: determine a coarse timing by detecting the synchronisation symbol.

Typically, the chipping code will be repeated multiple times in a given transmission frame. This means that the code can be shorter, which in turn makes it faster to detect. However, in this case, detecting the code-phase provides fine timing, but leaves a coarse timing ambiguity, because the receiver does not know which repetition of the code in the transmission frame has been detected. This can be resolved by providing a synchronisation symbol—for example, as the first symbol in each transmission frame.

The power-consumption monitoring device preferably comprises a time-domain correlator for detecting the code-phase.

It is desirable to keep the cost of the monitoring device as low as possible, since a separate device will be needed for monitoring each appliance or group of appliances (for example, sharing an extension lead) of interest. Using a time-domain correlator to detect the code-phase helps to simplify the device and therefore reduce its cost.

The monitoring device is preferably adapted to transmit to the master device an upstream signal which comprises a spreading code modulated by a data message, the data message comprising the power measurements, a transmit time-interval in which the upstream signal is transmitted and/or a transmit code-phase of the spreading code being defined relative to the detected code-phase of the reference signal.

By choosing a unique time-interval, the monitoring device can implement a Time-Division Multiple Access (TDMA) system. Alternatively or in addition, the device can operate a Code Division Multiple Access (CDMA) fashion, wherein the transmissions of different devices are modulated by spreading codes having low cross-correlation. Once again, to minimise complexity of the monitoring devices, it is preferable that they all use the same single, predefined spreading code. Therefore, low cross-correlation is achieved by using this single, shared spreading code with a different phase at each individual monitoring device. This is possible because they all share the same accurate global timing reference provided by the master controller/aggregator.

The monitoring device is preferably further adapted to transmit the upstream signal in a frequency band that is different from the frequency band of the spread-spectrum timing-reference signal received from the master device.

This may help to avoid a "near-far" problem, in which strong signals transmitted at the near end of the communications link interfere with the reception of the much weaker signals from the far end. For example, due to the near-far problem, the monitoring device may have difficulty detecting or maintaining synchronisation with the timing-reference signal, because of the relatively low signal level of this received signal compared with the power of the upstream signal transmitted by the monitoring device itself. Likewise, at the master/aggregator device, the (near-end) transmission of the timing-reference signal may interfere with the reception of the upstream signals from the (far-end) remote monitoring devices. By using a different frequency band for the upstream and downstream communication, the spread spectrum signals from opposite ends no longer interfere with one another. Thus, the system can benefit from the use of Frequency Division Multiplexing (FDM), in addition to the TDMA and/or CDMA techniques described above.

The monitoring device optionally has: a configuration mode, in which it is adapted to: transmit the upstream signal using a first, predetermined time interval and/or code-phase reserved for negotiation with the master device; and receive, from the master device, configuration information assigning a second, different time interval and/or code-phase, and a normal mode in which it is adapted to: transmit the upstream signal using the assigned, second time interval and/or code-phase.

In this way, when each monitoring node is first connected to the mains network, it will poll the master (aggregator) device in a time-slot and/or code-phase that is fixed and prearranged. The master device will assign one of the other time- and/or code-phase slots to the newly connected device and will transmit this configuration information back to the monitoring device. The configuration information may preferably be transmitted modulated on the spread-spectrum timing reference signal. Once configured, the monitoring device will use its uniquely assigned time-slot and/or code-phase for communication with the master device.

Also provided is a device for receiving data transmitted by one or more other devices, the device being adapted to generate and transmit a spread-spectrum timing-reference signal to the one or more other devices.

One advantageous use of this device is as a master-aggregating device in a power-consumption monitoring network, communicating over a power-line.

According to a second aspect of the first inventive concept, there is provided a master device, for receiving over a mains electrical circuit power-measurements transmitted by one or more power-consumption monitoring devices, the master device being adapted to generate and transmit a spread-spectrum timing-reference signal through the mains electrical circuit to the one or more monitoring devices.

This master device is thus adapted for use with the monitoring device summarised above.

The master device is further adapted to receive the power-measurements from each of the one or more monitoring devices with a predetermined timing that is defined relative to the code-phase of the transmitted timing-reference signal.

The master device is preferably adapted to receive from each of the one or more monitoring devices an upstream signal which comprises a spreading code modulated by a data message, the data message comprising the power measurements, the master device being further adapted to identify each individual monitoring device by the timing of reception of its upstream signal and/or the code-phase of the spreading code in the signal.

The monitoring devices all share the same timing reference, provided by the master. For this reason, it is possible for the master to identify each monitoring device from the (assigned) time-slot and/or code phase with which it transmits. This avoids the need for the node to identify itself to the master device—simplifying both the monitoring device itself and the communication protocol.

The master device is preferably adapted to transmit the spread-spectrum timing-reference signal in a frequency band that is different from a frequency band in which the upstream signals are received.

This helps reduce the effects of the near-far problem, as explained previously above, in connection with the monitoring device.

The master device preferably comprises a frequency-domain correlator for detecting the code-phase of the upstream signal from each of the one or more monitoring devices.

If each monitoring device transmits using a different code-phase, the master device needs to be able to detect multiple code-phases. This can be done by means of frequency-domain correlation.

According to a further aspect of the first inventive concept, there is provided a power-line communications network comprising: a master device as described above; and one or more power-consumption monitoring devices as described above.

Also provided is a power-consumption monitoring device, master device, or power-line communications network substantially as described herein and/or with reference to the accompanying drawings.

According to an aspect of a second inventive concept, there is provided a power-consumption monitoring device, for taking measurements of the power consumed by an appliance, the device being connectable to a mains electrical circuit and operable to transmit the measurements to a master device through the circuit, wherein the device is adapted:
to measure the energy consumed by the appliance in each of a series of time intervals, and maintain a first cumulative sum of the resulting energy measurements;
to periodically transmit, to the master device, a first quantised value representing the cumulative sum; and
to subtract the transmitted quantised value from the cumulative sum.

The quantisation error of the transmitted values is implicitly accounted for in the cumulative sum and carried over to the values transmitted in subsequent periods. Consequently, the total quantisation error does not accumulate, because errors in previous periods will be automatically corrected by subsequent transmissions.

The quantisation is preferably non-uniform, most preferably floating point quantisation.

Non-uniform quantisation means that quantisation is relatively more accurate for certain ranges of values. When the energy consumption falls in these ranges, previous quantisation errors will be corrected more accurately. Preferably the non-uniform quantisation is such that the magnitude of quantisation error is in direct relation to the magnitude of the value transmitted. This can be achieved by floating point quantisation, for example. The combination of floating point values with the maintenance of a cumulative sum of the amount of energy consumed means that a wide range of energy values can be represented with a small number of bits. Any residual error due to the quantisation into the floating point format will be cancelled out when the appliance is switched off, because the quantisation error will be minimal for values near zero. Consequently, for example, it will be possible to very accurately determine the total energy consumed by an appliance over the duration that it was switched on. Very high precision is achievable at the expense of a short delay in obtaining the precise value.

The device is preferably further adapted: to maintain a second cumulative sum of the energy measurements; and to intermittently transmit the value of the second cumulative sum to the master device.

The transmitted values are not subtracted from the second cumulative sum. Therefore, the second cumulative sum represents a sum of the entire history of energy measurements (for example, since the monitoring device was last activated, connected to the power monitoring network, or reset). Transmitting the whole sum of all energy measurements on an intermittent basis allows the master device to correct for errors that may be introduced if one or more of the periodic transmissions of the first quantised value were not received correctly. If only the first quantised values are considered, and a packet is lost, a systematic error may be introduced, because the master device will never discover the value of consumed energy encoded in the lost packet. Re-transmission of the full cumulative sum provides an opportunity for the master device to detect and recover from such errors. Thus, such a system can be made automatically self-correcting.

The intermittent transmission of the full cumulative sum may be performed at less frequent periodic intervals than the first quantised value; may be triggered by a request from the master device; and/or may be triggered based on detected network conditions. For example, if the monitoring device detects poor signal quality on the network, it may increase a frequency with which it transmits the value of the second cumulative sum.

The value of the second cumulative sum may be transmitted in place of one of the periodic transmissions of the first cumulative sum.

This means that one of the periodic transmissions of the first cumulative sum is suppressed and the second cumulative sum is transmitted instead. The master device should be aware that the replacement value has a different meaning. This awareness may result from the monitoring device signalling to the master that the second cumulative sum is being transmitted; or it may be implicit because the master device has previously requested the second cumulative sum to be transmitted; or because of an agreed timing of the transmission. The subsequent periodic transmitted value of the first cumulative sum may be correspondingly greater, as a result of the delay (because extra energy may have been consumed in the intervening extra period). However, the master device will be aware of this and may allocate part of the measurement to the preceding period. For example, the master device may assign half of the subsequently transmitted value to the current interval and half of the value to the previous interval (whose value was replaced by the second cumulative sum).

Upon receiving the second cumulative sum, the master device may retrospectively detect and correct errors in previously received values of the first cumulative sum.

Preferably, each monitoring device uses an error correcting code when transmitting the power measurements.

Different aspects of different inventive concepts can be combined, to realise particularly advantageous embodiments of the invention.

The invention will now be described by way of example with reference to the accompanying drawings, in which.

Figure 4:
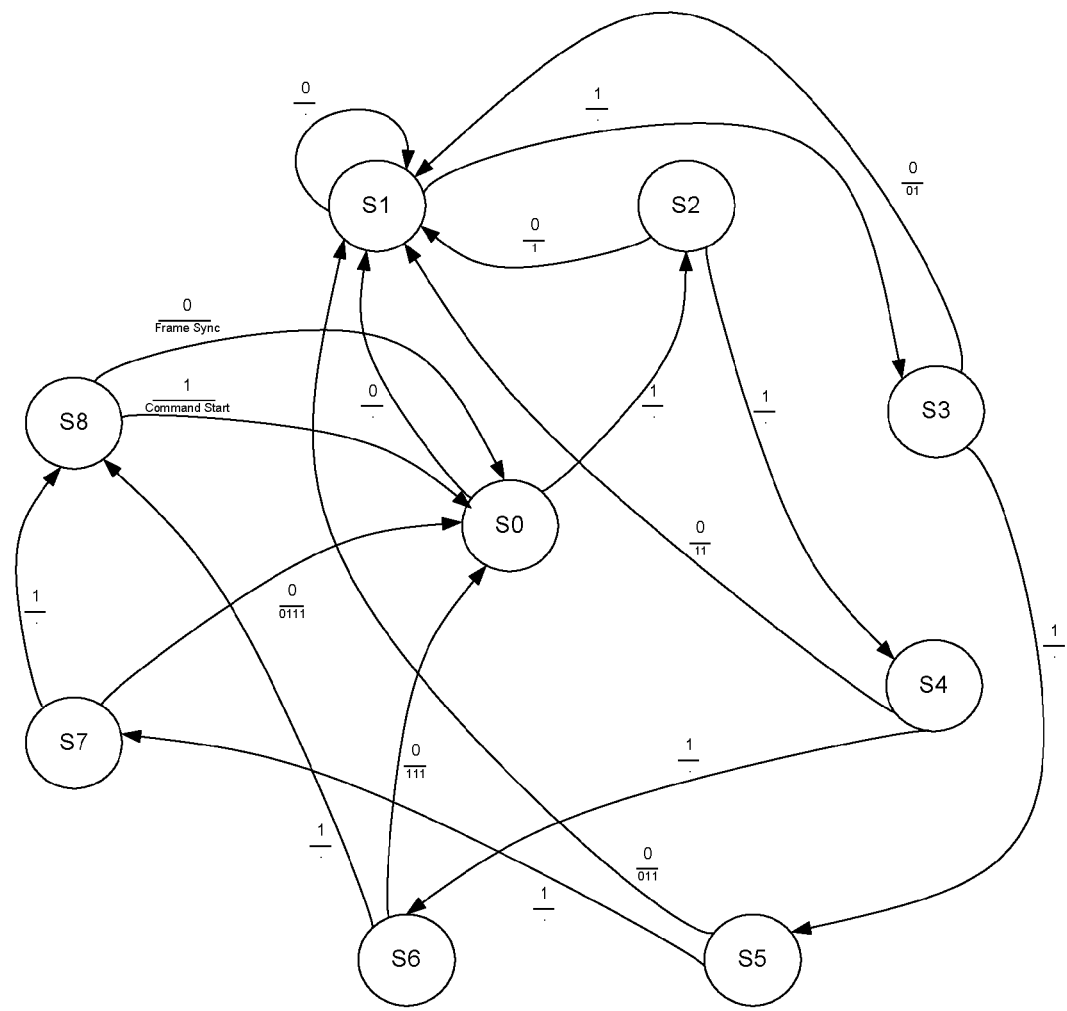
FIG. 4 illustrates the state transitions for a monitoring device receiving data from a master device, according to an embodiment.

Table 1 shows an example of calculations performed at a monitoring node, in order to send power-measurements to master aggregator;

Table 2 gives an example of a sequence of symbols transmitted by a monitoring device, and the corresponding symbols received at the master aggregator;

Table 3 summarises the state transitions for a monitoring node receiving data from the master aggregator, as illustrated in the state diagram of FIG. 4; and Table 4 shows how the algorithm of Table 3 is implemented with state encoding, according to an embodiment.

It should be noted that these figures are diagrammatic and not drawn to scale. Relative dimensions and proportions of parts of these figures have been shown exaggerated or reduced in size, for the sake of clarity and convenience in the drawings.

It is desired to have a large number of low cost 'configurable' nodes which can monitor power consumption of mains-powered electrically operated equipment and communicate the power consumed to a centralized aggregator using mains borne communications methods. In this description, the term "node" refers to a power-consumption monitoring device which transmits power-consumption measurements, and the term "aggregator" refers to a master device, which receives these measurements.

Key goals are to minimize the cost and complexity of the appliance-attached nodes, at the possible expense of complexity in the aggregator, so that the device nodes can be provided cheaply or even for no cost, to the end-user.

According to an embodiment of the invention, the network architecture requires a single device acting as an aggregator of information received from the device nodes. This can be coupled via the internet to application servers which provide the user level service applications and billing, through web-based applications.

By using powerline communications, the problems associated with RF interference and operating range from the aggregator are eliminated such that the user can install the equipment with no expertise, simply by plugging in the devices and connecting the aggregator to their home network.

The architecture requires that a large number of nodes be able to communicate with the aggregator using a limited channel bandwidth, for example, one of the Cenelec bands A, B, or C. The present embodiment of the invention uses Cenelec band B.

It is desirable to have a communications protocol which remains robust in the presence of short term wideband noise bursts. The architecture selected addresses this issue by using spread-spectrum techniques, whereby a number of nodes can transmit simultaneously at a much slower data rate, such that the typical noise duration is considerably shorter than the symbol duration. In this way it is possible to constrain these interference bursts such that they interfere typically with a single symbol and can therefore be overcome with error correcting codes.

Traditional packet based networks are inefficient, for the present purpose, since they require significant overheads to allow the receiver to synchronize to the transmitter; and significant inter-packet gaps to avoid interference between nodes, since the node timing often has a significant error.

The probability of an uncorrectable multi-bit error occurring in a packet is proportional to the packet length. Therefore, minimizing the packet length increases the integrity of communications. However, this is not practical when arbitration is required, because arbitration requires additional bits which cannot be protected by the FEC coding. Thus eliminating arbitration increases the overall integrity of the communications.

Additionally, when using RF networks, it is typically required to use a relatively stable reference oscillators both to meet regulations on spurious emissions and to avoid significant offsets due to residual carrier, which make signal demodulation difficult. Consequently, there is usually a sizeable pre-amble attached to each packet to allow the RF receiver to phase lock to the incoming signal before attempting to demodulate it.

The impact of these effects is that there is a significant overhead for each transmitted frame, which is not a problem when the frames are large as is common with data communications for file transfer and streaming media applications. This reflects the fact that these technologies have generally been designed for communication of large amounts of data in large bursts between a relatively small number of nodes. Unfortunately, the overhead becomes a significant limitation when the requirement is to transmit a large number of short data packets from a very large number of nodes—as in the present application.

The communications architecture of the present invention can take advantage of the installed wiring in the home to provide low-cost transfer of small data packets, or short datagram-type transfers where communication is reliable enough that an acknowledgement sequence is not required.

This protocol makes efficient use of the available bandwidth, by avoiding complex arbitration schemes and phase locked receivers which require training sequences (preambles) at the start of each frame, since the overheads of these processes could dominate the communications to the point where they become a limiting factor in the achievable throughput and/or number of nodes.

To achieve this, embodiments of the present invention use a master timing reference, which must be within a bounded uncertainty on all nodes, since this determines the idle period between frames. The idle period must be as short as possible to maximize efficiency, but long enough to prevent collision between frames from alternative channels. This can be achieved using spreading codes.

Using a spreading code transmitted from a master device we can easily achieve a timing-uncertainty of much less that 1 microsecond in a typical residential building. The largest part of this uncertainty is due to the time taken for the signal to traverse the mains wiring. Typically the signal propagation in mains wiring will be around 0.6 C, or 200 metres/microsecond.

One drawback of using correlation is the requirement for searching when a device is turned on: it must search all possible phases of the spreading code in order to detect it, and then typically will track the spreading code phase using multiple correlator fingers.

If we transmit a spreading code continuously then we can easily track a code of any length. However, to minimize the time; complexity; and cost of searching for the code in the startup phase, we require the code to be relatively short compared to the duration of the data frames it is marking. Typically, a code of around 128 chips duration transmitted at 6 Khz would repeat every 20 ms or so, whereas a data frame may take several hundred ms to complete; hence, the code is repeated and modulated with an additional frame-timing marker signal, which is used to resolve the frame timing ambiguity.

Additionally, use of a master transmitted spreading code for timing is not only highly robust but provides information to the node which can be used to tune a low-cost oscillator, in order to maintain a highly accurate frequency for transmission of data from the node. This minimizes the correlation losses at the receiver (the master aggregator device) and hence improves the received Signal-to-Noise Ratio (SNR).

When using a modulated spreading code, it is impossible for the receiver initially to determine the phase of the carrier and hence the phase of the modulating signal, however this can easily be overcome as will be described later.

This modulation of the spreading code then provides a means of communicating in a broadcast manner between the aggregator and all attached nodes, and a protocol is defined for the modulating signal which allows both data transmission and frame timing synchronization to be achieved.

Once the monitoring node has an accurate knowledge of the system timing it needs to know when to transmit. According to the present embodiment, this decision is made at the transmitting node based on some previously agreed timing constraints.

In a low cost application which should be "plug-and-play", from the user's perspective, it is not possible to manually program each node uniquely at manufacture, or to provide switches for configuration. As a result, a self configuration mechanism is needed, which allows a node to discover a suitable set of parameters (such as time-slot) for its transmissions.

This results in additional challenges when using spreading codes, since traditionally channels sharing the same frequency will use different spreading codes to avoid interference. According to the present embodiment, when a node is connected for the first time, it will enter a discovery and configuration mode. Once configured, it will then enter the general communications mode whereby the arbitration is implicit from the systems frame timing marker and the information saved during the configuration process.

This has several advantages. Firstly, it minimizes cost and complexity; and secondly, it allows the aggregator to selectively configure the nodes at startup so that the best SNR can be achieved during each time slot.

In order to maintain the best communications integrity and maximize the number of nodes that can be connected, the present embodiment combines the arbitrated access to the medium using time slots with CDMA access techniques such that at any time a subset of the nodes in the system are simultaneously transmitting data using spread spectrum techniques. This mitigates the bursty noise in the system.

The overall throughput is a function of the wiring environment in the mains electricity circuit, and the aggregator will manage the available bandwidth by configuring the nodes into sets that share each time slot, and configuring the overall frame repetition rate to ensure that all nodes gain equal access to the communications channel.

The algorithm for allocating these resources can take into consideration the SNR that is being achieved in each time slot: a default minimum number of time slots is initially configured, and then nodes are added sequentially according to the time slot which has the best SNR As the SNR approaches a threshold where further allocation of nodes would reduce signal integrity, the aggregator will simply add more capacity by increasing the number of time slots used. Consequently, the nodes which are reporting their measurements to the aggregator should be flexible enough to support a variable frame rate, and reference their transmit slots as a number of time slots from the frame timing marker.

For transmission from the nodes to the aggregator, the present embodiment uses CDMA, allowing a number of nodes to transmit simultaneously. With this approach, the data bit duration (and hence frame duration) is extended. However as there are more nodes transmitting simultaneously, the data throughput overall is maintained. This technique has several benefits: firstly, it is very reliable in the presence of noise; and secondly, since the bit duration is significantly increased, the guard period becomes negligible in comparison. Accordingly, it becomes possible to de-modulate the signal and recover the data stream without any bit-synchronization process.

At the aggregator the received signal contains the carrier from all transmitting nodes, which must be demodulated. However, each node will have a varying carrier phase with respect to the master clock, and this will also be drifting.

To avoid the requirement for the aggregator to synchronize to each node, which would require multiple correlators and a training sequence, the present embodiment uses a simple Binary Phase Shift Keyed (BPSK) coding of the data. This coding provides only 2 symbol states with a 180 degree phase shift, meaning that the received data can be simply decoded without any training sequence and having only the ambiguity of the initial code phase. At the start of reception of a frame the aggregator must first search for the spreading code of each node. To minimize complexity, all nodes will transmit at the same time using the same spreading code, which will be phase shifted for each transmitting node so that the energy from each node will appear within different non-overlapping code phase windows at the output of a frequency domain correlator in the aggregator.

Using a frequency-domain correlator makes the search process more efficient, since all code phases are correlated simultaneously. Because one shared spreading code is used, it is not necessary to perform a frequency domain correlation for multiple spreading codes.

For the present embodiment, a 128 chip code sequence has been selected, which has the lowest cross correlation at all un-aligned phase shifts. In this way, the interference between nodes is minimized.

When demodulating the data at the aggregator, it is necessary to determine the phase of the transmitted signal. This can be done by exploiting the BPSK modulation of the spreading code, which has been found to work well using a simple Non-Return-to-Zero (NRZ) encoding scheme and BPSK modulation. The approach is similar to that used in the context of GPS receivers for tracking satellite signals.

Given a large number of nodes transmitting simultaneously, and also time domain multiplexing of the nodes, it is not possible for the aggregator to track each of them since this would involve changing the timing of the correlator. However, even with a significant carrier offset (residual carrier) it is possible to correlate against the spreading code and make carrier phase measurements by looking at the complex correlator output. This closes the tracking loop, by monitoring the phase rotation rate of the complex correlator outputs.

By using BPSK modulation and simply measuring the code-phase of the correlation peaks, it is not necessary to track the absolute signal phase. Instead the aggregator can merely determine the relative carrier phase of each coherent correlation, there being a 180 degree phase shift for every change in modulation. In addition to BPSK modulation, each node will use Non-Return-to-Zero Inverted (NZRi) encoding of the data, such that there is a 180 degree phase shift for each 1; and a 0 degree phase shift for every 0, transmitted. In this way, any error in detecting a phase change will result in just 2 bits of the received message being corrupted. This then enables Forward Error Correction (FEC) techniques to mitigate this problem.

Without the NRZ or NRZi encoding, in order to overcome the initial phase ambiguity it would be necessary to know the first data bit transmitted. That is, each frame would have to start with a known bit polarity to provide a reference. This would of course make the system highly susceptible to failures in the detection of this start bit.

The protocol outlined above can work reliably provided that the relative carrier frequencies of the node and aggregator are sufficiently close; however. the main source of uncertainty is that of the internal clock in each node. Provided the node's clock is relatively accurate, we will see a small phase rotation for each data symbol due to the clock discrepancies. This should be sufficiently constrained that the phase rotation due to the clock is insignificant over a symbol period. In the architecture of this embodiment, each node has an accurate time reference derived from the received spreading code and can use this to correct clock errors if a very low-cost clock is used. This leaves the problem of maintaining the code-phase, which will be solved by re-aligning at the start of each data frame. The system is therefore tolerant to significant clock drift during a frame period.

The remaining phase-uncertainty in the correlator is attributable to the noise power, which will be dominated by the other CDMA channels (corresponding to other nodes) transmitting power in the same frequency band. This limits the number of channels that can be transmitting at the same time, since a strong signal from a node located near to the aggregator could cause the SNR of the signal from a distant node to fall below an acceptable level.

In general, the acceptable signal level is one where the effect of noise causes an ambiguity in the correlator output phase measurements of significantly less than +/−90 degrees. This is achieved by controlling the transmit power in order to make the relative signal power observed at the aggregator approximately equal for each node. This can be achieved by the aggregator sending a simple broadcast message indicating which nodes should increase or decrease their transmit power.

By using NRZi encoding, the susceptibility of the system to the misdetection of the phase of the first data bit is removed. However, this results in one drawback: failure to correctly detect the phase of one symbol will result in a multi-bit error, because it will either insert or remove an additional transition for the following symbol. As a side-benefit, however, a failure to detect 2 symbols correctly will never result in 2 adjacent bits being received incorrectly.

Single bit errors can be corrected by hamming codes, using a forward error correction algorithm. The present embodiment uses 11B/15B encoding, in which each group of 11 bits is replaced by 15 bits such that any single bit error can be detected and corrected. These codes cannot correct multiple bit errors and will sometimes not detect them. To overcome this, a block interleaving is used to spread a multi-bit error between several data blocks such that each block receives a single correctable bit error.

The signalling system outlined above will result in a reasonably reliable communications protocol. Nevertheless there will still be errors resulting from corrupted packets. Since the primary application is for power monitoring, it is considered acceptable to achieve a packet transfer rate of >95% since this will result in an accuracy of better than 5% in the overall power monitoring, a figure which is deemed accurate enough for the purposes of monitoring where power is being consumed. Note that this is much less than would be acceptable in most conventional data-communication applications.

In order to accommodate a wide range of power-consumption values, and to indicate the power accurately without sending unnecessarily high-precision data (which would lengthen the message), the power is communicated using a floating-point format.

For example, assuming that we need to accommodate values in the range 1 to 3000 Joules/Second, then the maximum value 3000 would require 13 data bits to represent it, if an unsigned fixed point format with accuracy of 1 Joule was to be used. (It is assumed that the energy consumed can never be negative, so an unsigned value is adequate).

Instead, in the present embodiment, a 15 bit floating-point value is used, in which 11 bits are allocated to the mantissa and 4 bits to the exponent, giving a range of $[0 \text{ to } 2047]*2^{[0 \text{ to } 15]}$ Joules.

The node accumulates the sum of the total power (energy) consumed, as measurements are made. In each frame, a value is transmitted using the floating-point format described above. Because of the limited precision of this format, only values less than or equal to 2047 Joules can be guaranteed to be encoded accurately. From 2048 Joules to 4095 Joules, the transmitted values are quantised in steps of 2 Joules. From 4096 to 8191 Joules, the step size is 4 Joules, and so on. Consequently, the floating-point, quantised, transmitted value will generally not be exactly equal to the current value of the accumulated sum. To account for this quantisation error, and avoid the build up of cumulative errors at the receiver (aggregator), the transmitted quantised value is subtracted from the stored cumulative sum. The energy consumed in subsequent intervals continues to be added to the sum; so, the next time the cumulative sum is quantised and a value transmitted, it will incorporate both the newly consumed energy, and the residual quantisation error from the previous transmission. In this way, subsequent quantised transmitted values will correct the quantisation error introduced in previous values. Thus there is no loss of overall precision but a short delay in communicating the precise power usage. Most appliances will be switched off at some times of the day. When the power consumption drops to zero, the residual quantisation error in the stored cumulative sum can be completely eliminated, because the remaining quantity to be transmitted will eventually drop below 2048 Joules, to a value that can be represented precisely. Note that the quantisation always rounds down to the nearest number that can be represented in the 15-bit floating point format.

Table 1 shows an example of the calculations performed and values transmitted, for the case of an appliance consuming 2551 Joules/second and transmitting at 1 second intervals (corresponding to a 1 second transmission frame). In this case, for simplicity, a smaller 5,3 bit floating point value is used. The equipment operates for 9 seconds.

The power is indicated in the Watts column, and total energy consumed is accumulated in the Joules column. The accumulated energy values Sum are accumulated each second. Message represents the quantised value sent during the interval, which is the largest value less than the accumulated sum that can be represented using 8 bits as 3 bit exponent, 5 bit mantissa unsigned representation. In this example, a message is sent every two seconds.

For example, at time 2, Sum is 2551 representing the joules consumed up to that instant. The closest smaller number that can be represented in this format is 2528 ($79*2^5$), encoded as Mantissa=79, exponent=5. The value 2528 is therefore transmitted and subtracted from the accumulated value for Sum, and the next energy reading is accumulated with the remaining 23 joules (2551+2551−2528)=2574 joules.

TABLE 1

| time | Watts | Joules | Sum | Message |
|------|-------|--------|------|---------|
| 1 | 2551 | 2551 | 2551 | |
| 2 | 2551 | 5102 | 2574 | 2528 |
| 3 | 2551 | 7653 | 5125 | |
| 4 | 2551 | 10204 | 2556 | 5120 |
| 5 | 2551 | 12755 | 5107 | |
| 6 | 2551 | 15306 | 2602 | 5056 |
| 7 | 2551 | 17857 | 5153 | |
| 8 | 2551 | 20408 | 2584 | 5120 |
| 9 | 2551 | 22959 | 5135 | |
| 10 | 0 | 22959 | 15 | 5120 |
| 11 | 0 | 22959 | 15 | |
| 12 | 0 | 22959 | 0 | 15 |
| 13 | 0 | 22959 | 0 | |
| Total | 22959 | | | 22959 |

If one of the messages is corrupted or lost (that is, an erroneous value is decoded at the aggregator or the packet is lost) then a systematic error may be introduced. The node assumes that the aggregator has correctly received all the messages—it has no way of knowing (in the absence of a higher-level message acknowledgement protocol) when the aggregator fails to receive a message correctly. In some circumstances, the aggregator may be able to detect that the message has been received incorrectly (for example, using error detection or error correction codes) or may recognise that the periodic pattern of transmissions from a particular node has been interrupted. However, to recover from an "uncorrectable" error, some further mechanism is needed.

For this reason, in the present embodiment, each node maintains a separate total cumulative sum of the energy measurements. This total is equivalent to the current cumulative sum described above, but without decrementing each time a quantised value is transmitted. In Table 1, above, the total cumulative sum is indicated by the column "Joules". The node transmits this total value to the aggregator occasionally. When the aggregator receives the total value, it can correct for any previous errors, allowing it to re-synchronise the running total with the node.

The trigger for a transmission of the total value is based on signal conditions, and/or a request from the aggregator. The total value is also transmitted periodically (e.g. after a fixed number of ordinary messages) and each time the node is powered up.

In the presently described embodiment, the total cumulative value replaces one of the ordinary periodic messages. This avoids the need to transmit additional data. However, it results in the effective loss of one of the measurements as it is replaced by the start of a cumulative power message. Nevertheless, the energy consumption is still accumulated in the node and is incorporated in the value transmitted in the following message. The aggregator, knowing that it previously received a message containing the total cumulative sum, filters the message pair so that the following value is averaged over the 2 measurement periods, hiding the missing measurement.

In this way, the system is self recovering and systematic offsets will not propagate indefinitely. Once the aggregator receives a correction, it can detect if it had previously received a false message and compute what that should have been, using the later total cumulative value. Consequently, when looking back at the history of measurements, the faulty or missing message does not cause a problem.

The key functions of the master/aggregator and monitoring device/node, and the differences between them, are outlined below.

The Aggregator transmits a PN sequence at a reference carrier frequency. This PN sequence provides a timing and frequency reference to all the low cost device nodes. The signal is modulated with a synchronization code for framing, and can additionally carry other messaging information between the frame synch markers.

The Aggregator operates a multi channel correlator using frequency domain correlation and demodulates the BPSK signal to extract an NRZi encoded data channel for each node.

The data channel is decoded and the aggregator accumulates the consumed power for each node.

In addition, the aggregator continuously monitors a dedicated slot (Slot 0, phase offset 0) to identify the introduction of new nodes and configures the new nodes according to the current system conditions (for example, by reference to SNR).

While receiving the data channels there is no need for the nodes to identify themselves or for the aggregator to poll or address each node. Instead, this is implicit in the code phase and time slot. The aggregator will also monitor the received power (SNR) for each channel and will periodically send broadcast power control messages which will command nodes to increase or decrease their transmit power to maintain appropriate SNR and BER at the aggregator.

The monitoring device node is a low-cost node which monitors power and accumulates energy readings which it communicates to the aggregator using a message stream of quantised, accumulated values.

The node implements a simpler, time-domain correlator, which it uses to detect the synchronization code from the aggregator. It uses this code to synchronize its transmissions and, in the present embodiment, also uses the frame timing to compute and correct local clock errors.

The node performs a search using time domain correlation and once it has detected the frame timing marker and received configuration information it enters a tracking mode in which it continuously monitors the code and centres it in the correlator. It then uses the frame timing marker to synchronise transmission of the power-measurement messages to the aggregator in its allocated time slot, and with the appropriately shifted spreading code.

In order to decode the BPSK modulation it is necessary to have a sufficient SNR at the receiver such that the uncertainty in the phase angle is less than +/−90 degrees, and in fact it should be considerably less to maintain integrity. There are three main issues that influence the accuracy of the phase detection:

1. Frequency Offset: If the transmitting node carrier frequency is different to the receiver carrier frequency, there will be an inherent phase rotation between each correlation period.
2. Receive Power: If the receive power is low, the precision of the correlator output is reduced, resulting in loss of phase resolution
3. SNR: If a signal is received in the presence of noise, this noise will typically be Gaussian and different between the I/Q channels. Since the major source of noise is other nodes transmitting at the same time, it is desirable to minimize this noise by selecting a spreading code with the lowest auto-correlation for non-zero shifts. Analysis has shown that for this purpose the m-code PN[7 4 3 2] offers the lowest cross correlation of all 128 bit codes, therefore this is used for the node to aggregator channel.

It is necessary to use a different spreading code for the timing synchronization channel. One such suitable code is m-code [7 6 5 4], although there are several other possibilities. The precise code for this channel should be selected as the code with the lowest cross correlation with the PN [7 4 3 2]. The auto-correlation is not an important consideration for this code, because it is transmitted only by the aggregator.

Multi-path effects (from, for example, a ring main topology) do not have a significant impact. At Cenelec band B (100 Khz) the wavelength is approximately 2 KM (at 0.66 C), in a residential or small-scale commercial environment it is extremely unlikely to see cable lengths more than 100M from the consumer unit; consequently, destructive interference is extremely low, unlike higher frequency RF solutions with wavelengths of the order of 12.5 cm In the present embodiment the aggregator must despread multiple simultaneous spreading codes with a phase uncertainty of approx 1-2 microseconds. This could be achieved using time domain or frequency domain techniques. However, time domain techniques would however require a large number of physical correlators, or time domain duplexing of smaller correlator resources, which is relatively inefficient and would generally require an FPGA or ASIC implementation, increasing complexity and therefore cost.

For these reasons, the present embodiment implements correlation in the frequency domain. This uses an FFT/iFFT approach similar to that is sometimes used in the search phase in GPS receivers. There are a number of requirements and/or limitations:

1. The FFT can only despread a single spreading code sequence;
2. All code phases must be computed even when few are needed;
3. Samples must be synchronous to any data modulation or else significant losses will occur.

As explained above, the same spreading code is used in each transmitting node, but this code is phase-shifted such that the autocorrelation between codes from different nodes is zero. The code is modulated synchronously to the master timing reference—that is, each node will modulate the spreading code with a different phase offset.

The aggregator samples one PN length of data, performs an FFT based correlation and obtains all signals from all transmitting nodes. Repeating this process for each data-bit period, the data is then extracted by a phase comparison of the complex correlator outputs per channel, between bit periods. The exact data-bit timing for the node can be determined by computing the energy, and then the complex values can be interpolated to get the peak phase. After that, the phase change between bit periods is computed to recover the NRZi encoded bit stream.

It is desirable to implement the Node with minimum cost; consequently, it is preferable to avoid a large correlation array. However, it is also not practical to implement the correlation entirely in software, due to the rate at which samples must be processed. The main limitation of having a small number of correlator taps is the time taken to synchronize to the master timing reference when a node is first turned on. However, it is desirable to have a long code transmitted by the aggregator to provide the timing reference.

To address these issues, in the present embodiment, the aggregator transmits a spreading code which will be modulated by a slower bit sequence (each bit of the bit sequence modulates one repetition of the spreading code). The PN (spreading) code provides resolution at the sub 1-2 ms level, and the bit sequence resolves the higher-level ambiguity. This enables accurate time at (for example) 2 seconds granularity to be determined, using a marker bit sequence such that the marker bit sequence is transmitted every 2 secs. The remaining repetitions of the spreading code can then be modulated with any other desirable data. Bit stuffing is used to ensure that a specific sequence can never be received from a normally modulated data stream, and this reserved sequence is used as a marker.

The code length can be the same length or a multiple of the length of the code used to communicate from the device to the aggregator (but using a different spreading code). Having a short spreading code, a number of small partial correlators are implemented in a low-cost FPGA. These produce results at a lower rate that can be further integrated by software using a software controller search, as follows:

Each partial correlator accumulates using hardware (HW) for a small number of PN code chips, these 'partial' correlation results are produced at a lower rate than the chipping rate since this is too fast for software (SW) accumulation, but at a multiple of the PN rate, allowing further accumulation using SW to correlate over the full PN length.

1. Search at increasing code-phases until an energy peak is detected;
2. Track the peak for a few cycles using software to compute the code-phase rotation rate and update a Phase-Locked Loop (PLL) to fine tune the oscillator;
3. Decode the complex phase to determine data sequence and sync point.

One exemplary embodiment of the system will now be described in greater detail.

Figure 1:
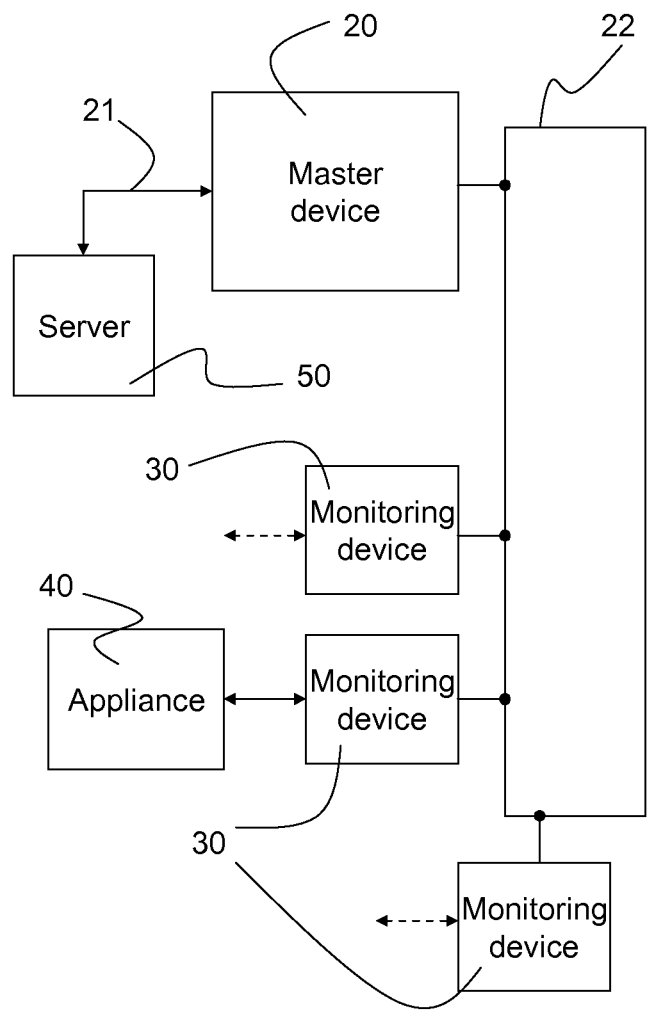
FIG. 1 shows a master device and a plurality of monitoring devices connected in a power-line network.

FIG. 1 shows an example of a network according to an embodiment. A master (aggregator) device 20 and three remote monitoring devices 30 are connected to a mains electrical circuit 22, which is a ring main. An appliance 40, whose power consumption is to be monitored, is connected to a monitoring devices 30. In this embodiment, the appliance is also connected to the mains power supply 22 through the monitoring device 30. The master device 20 configures each monitoring device 30 as it is connected to the network. Once configured, each monitoring device 30 transmits measurements intermittently at regular intervals. These measurements are received by the aggregator 20 and forwarded to a server 50, over an internet connection 21.

The signal transmitted on the power-line by each device is a sine wave modulated with an m-code sequence and NRZi data stream using BPSK encoding, therefore we need to consider symbols at both the chipping rate of the m-code and the data sequence.

Let the mSequence be a repeating 128 symbol binary sequence m0 . . . m127 with values −1, +1 with symbol period Pm Let the mCode phase offset be Mp (0<=Mp<128)

Let the data sequence be an NRZI encoded binary sequence d0, d1 . . . dn, where the value of d at time t is represented by d(t) having values of +/−1, and the data is used to modulate the mSequence at the rate of 1 data symbol per mSequence symbol.

Let the period of symbols d(n) be represented as Pd, hence Pm=128 Pd

The data symbol at time t is d(t)=d(t/Pd).

The mSequence value at time t is m(((t+Mp*Pm)Mod Pd)/Pm)

Thus the signal transmitted is d(t/Pd)*m(((t+Mp*Pm)Mod Pd)/pm)*(cos(N)+j sin(f*t)) where f is the frequency of the carrier, this modulation allows simple inversion of the carrier which can be generated as a single sine wave (sqrt(2)*sin (f*t−pi/4)).

As we can see later, the pi/4 phase shift can be ignored as it is a constant phase offset At the receiver the signal is sampled as a complex value pair I,Q (in-phase/Quadrature) representing Cos(ft)+j Sin(ft).

This signal is filtered and down converted by multiplying by the local oscillator at frequency −f1 to produce a complex 'baseband' signal Sb=(Cos(f*t)+j Sin(f*t))*(Cos(f1*t)−j Sin (f1*t)), note that the frequency is 'negative' since the quadrature component leads the in-phase component The resulting signal is Sb=Cos((f−f1)*t)+j Sin((f−f1)*t).

Consequently by settings f1 to be the same as the transmit frequency we produce a complex baseband signal which we can then de-spread and decode.

In practice the frequency of local oscillator f1 needs to be frequency and phase locked to the transmit frequency f to generate a true baseband signal, which is normally achieved using a training sequence to lock a PLL, however this is inefficient for short data packets where the throughput would become limited by the training sequence length.

The alternative approach used in the present embodiment is to accept that there will be a frequency discrepancy between the local oscillator f1 and the transmit carrier frequency f, and to accommodate the resulting residual frequency on the 'baseband' signal in the demodulating stage.

Since the output of the down conversion stage is d(t/Pd)*m (((t+Mp*Pm)Mod Pd)/pm)*(cos(fb*t)−j Sin(fb*t)), we then multiply by the replica mSequence to extract the data symbols.

Multiplying by the replica mSequence we get a symbol complex symbol sequence:

$$d(t/Pd)*m(((t+Mp*Pm)\text{Mod }Pd)/pm)*(\cos(fb*t)+j\ \text{Sin}(fb*t))*m(((t+Mp*Pm)\text{Mod }Pd)/(pm*f1/f)).$$

Provided that the local oscillator frequency is close enough to the transmit carrier frequency f1/f is close enough to 1 to be ignored and we get the symbol sequence:

$$d(t/Pd)*(\cos(fb*t)+j\ \text{Sin}(fb*t))$$

where fb is the residual carrier in the baseband signal due to frequency differences in the oscillators.

The energy is integrated coherently over time Pd to despread the signal which gives a resulting symbol of:

$$d(T)*(\cos(fb\cdot T)+j\ \text{Sin}(fb\cdot T)).$$

Since we are using BPSK modulation it is therefore a process of taking atan(d(t/Pd)j Sin(fb*t))/d(t/Pd)j Sin(fb*t)) and measuring the phase shift to extract the d(t/Pd) symbol sequence.

In practice fb is close to zero and the resulting symbols are phase rotated by Pd*fb with respect to adjacent symbols, and by 180 degrees in the case of a symbol inversion, since the effect of fb is cumulative the data is extracted by relevant phase measurements of the received symbols rather than absolute phase measurements, thus allowing for fb to be ignored regardless of the frame duration.

There are several losses associated with this which are all a function of the residual carrier fb, firstly there is the loss due to signal phase rotation during integration, which typically follows the sin c(x) function, and secondly there is the loss due to cumulative phase shift between the mSequence chips. In reality both of these losses are a function of the total phase rotation of the residual carrier during a coherent integration period, since the correlation is restarted at the beginning of each coherent period, and because we are using relative phase between symbols rather than absolute phase for symbol decoding.

In a normal high speed communication system it is impractical to perform relative phase comparisons between symbols due to the processing power involved in calculating the atan function, however in a low data rate application using BPSK this becomes practical since it is not necessary to compute the actual phase angle, merely the gradient of the line through the constellation point and the origin, for each symbol we measure the gradient of this line and determine the relative gradient of the previous symbol, which requires a single division operation rather than transcendental math functions. For each symbol the gradient of the line through the origin is computed and compared against the gradient for the previous symbol, then stored for use with the next symbol, alternatively each symbol can be multiplied by the complex conjugate of the previous symbol, effectively rotating it to normalize the phase offset for the previous symbol By way of example, Table 2 indicates a signal transmitted by the Node, sequence S0 . . . S6 with I/Q values at 56 (ignoring dimensions), these are transmitted using a single sine wave at phase angles 45 degrees and 225 degrees representing 1(1) and −1(0).

These are distorted by the medium and phase shifted by a baseband residual carrier, so after carrier removal filtering, sampling, and despreading at the receiver they are output from the correlator as the values R0 . . . R6, the vectors being represented by the solid lines, and the dotted lines being a continuation of the vectors with 180 degree phase shift.

TABLE 2

| Sym | In Phase | Quad | | | |
|---|---|---|---|---|---|
| S0 | 56 | 56 | 1 | | |
| S1 | −56 | −56 | −1 | | |
| S2 | −56 | −56 | −1 | | |
| S3 | 56 | 56 | 1 | | |
| S4 | 56 | 56 | 1 | | |
| S5 | −56 | −56 | −1 | | |
| | | | In Phase | | |
| init | 56 | 56 | 45 | 1 | 1 |
| r0 | 60 | 41 | 5656 | 1 | 1 |
| r1 | −53 | −19 | −3959 | −1 | −1 |
| r2 | −53 | 4 | 2733 | 1 | −1 |
| r3 | 37 | −32 | −2089 | −1 | 1 |
| r4 | 24 | −41 | 2200 | 1 | 1 |
| r5 | −4 | 43 | −1859 | −1 | −1 |

After receiving the attenuated and distorted signals it is clear that decoding the signal using conventional means is impossible, however it is only necessary to compute the sign of the rotated in-phase component to correctly recover the signal by applying the previous symbol value as a rotation parameter.

Since we are working with a complex signal we need simply to compute the result:

SIGN(Q(n)*Q(n−1)+I(n)*I(n−1)), represented by the In Phase column in Table 2.

Since we are applying a rotation to each symbol to correct the phase, 2 symbols with the same phase would cancel each other out, and 2 symbols with large phase differences would produce a large phase offset, consequently the symbol sequence decoded in this manner is actually indicating a change of symbol rather than the symbol value itself.

To overcome this we transmit a single symbol for training which is discarded, we assume this signal to represent a 1, then all following symbols are correctly decoded even with large residual carrier by multiplying the sign of the in-phase component with the previous decoded symbol, as seen in the last column of Table 2, where the symbol sequence has been correctly decoded.

This is a simple approach which can be utilized simply on the low cost node for decoding the messages from the aggregator, however a slightly more robust method may be employed on the aggregator, or as an extension of the above method wherein the aggregator can assume that the rotation due to residual carrier is constant over significant periods of time, therefore it can compute the expected phase rotation by monitoring the phase drift over time for each node, this can then be used to compute the expected phase rotation to be applied to each symbol as an absolute value derived from the first received symbol and a fixed rotation per symbol, this rotation can then be applied to decode each symbol resulting in a symbol stream representing the real data values rather than their changes.

In such a mechanism it is again only necessary to compute the in-phase component of each value in order to decode the original symbol stream.

Figure 2:
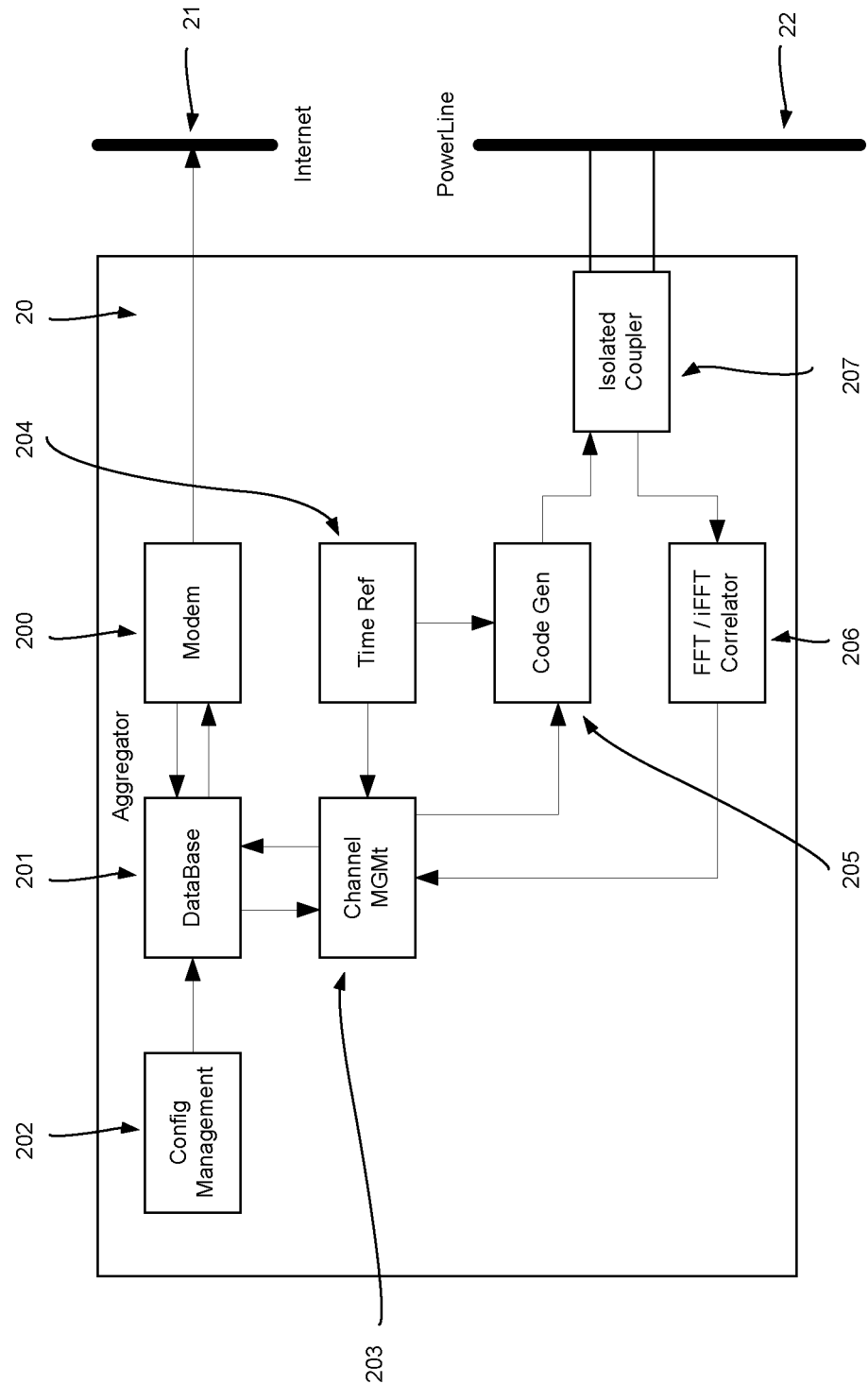
FIG. 2 is a block diagram of a master device according to an embodiment of the invention.

The block diagram of FIG. 2 shows the basic architecture of the aggregator 20 which connects to powerline 22 through an isolated coupler 207 and communicates with a centralized server via modem 200 and internet 21.

The aggregator 20 maintains a database of information 201 including the configuration of the nodes on the network and the power measurements which it communicates to the centralized server on demand.

Database 201 is configured via a user configuration interface 202 which may incorporate keyboards, displays, pc interfaces, or even mobile device interfaces such as Bluetooth, this interface is used primarily for configuration of new nodes when they are added to the system since the power management information is a subscription service.

The aggregator controls the in home devices using a signal transmitted over the powerline 22 using the code generator 205 which generates a modulated spreading coded under control of the channel management block 203 and the central time reference 204, this time reference serves as the master time reference for the entire network.

The channel management unit 203 generates and sequences the control sequences required for network framing.

Data received from the powerline is de-spread using a frequency domain correlation unit 206 which produces a number of outputs corresponding to each of the energy peaks in the received signal, these peaks are demodulated and decoded by the channel management unit 203 which determines the node that transmitted each data symbol and rebuilds the messages associating them with attached nodes according to the configuration stored in the database 201, accumulated power information is then stored in database 201 until communicated with the master server via the internet 21.

Figure 3:
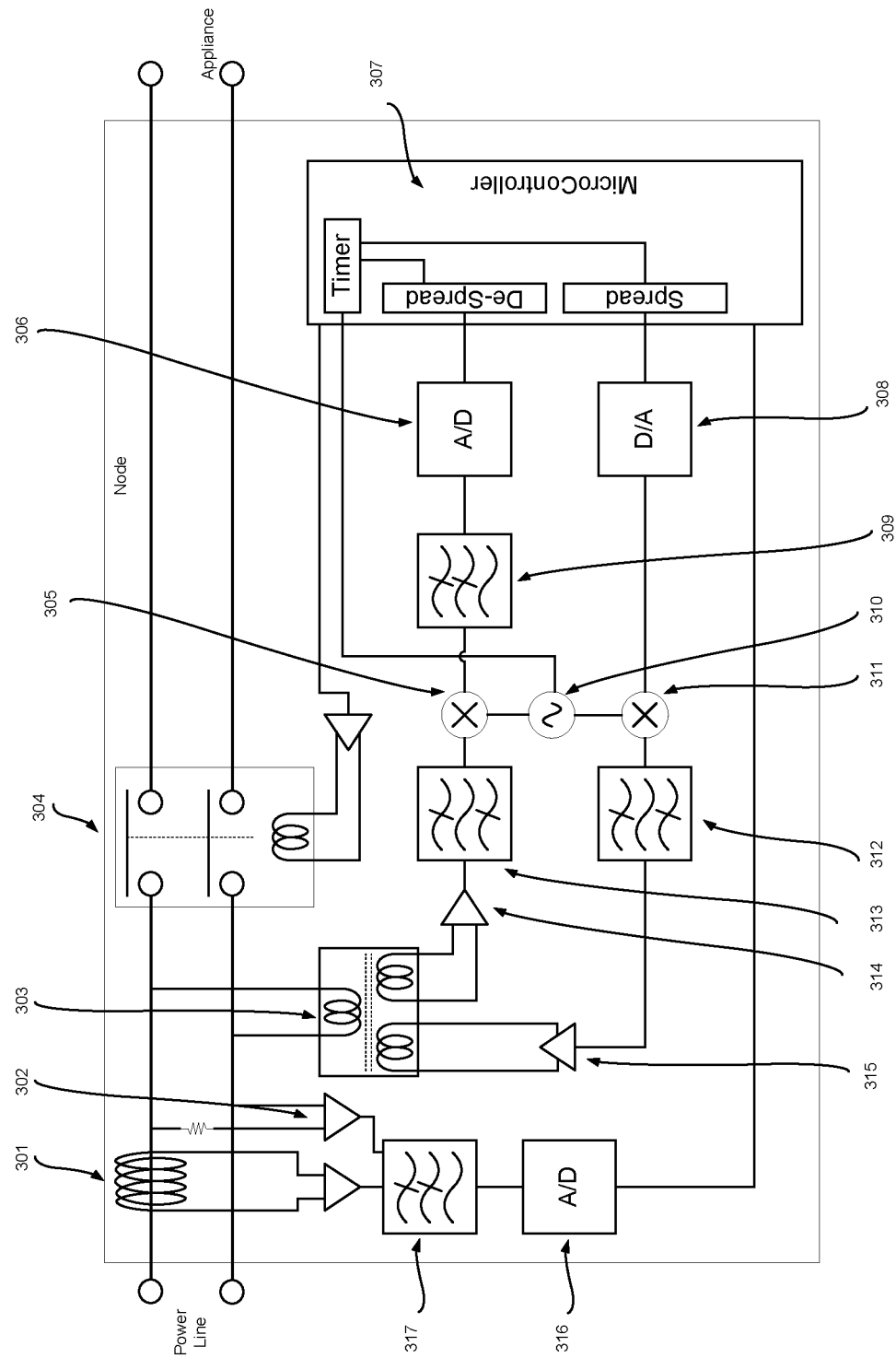
FIG. 3 is a block diagram of a power-consumption monitoring device according to an embodiment of the invention.

An example node architecture is shown in FIG. 3.

The powerline voltage and appliance current consumption are sampled with appropriate circuitry 301,302, the outputs of which are low pass filtered by filter block 317 and digitized by A/D converter 316, the results of which are passed to microcontroller 307 which logs the current/voltage over time and builds a record of the appliance power consumption.

The microcontroller can optionally be used to control the appliance power under control from the powerline administration system (Aggregator) using relay 304.

Communications data consisting of spread spectrum signals modulated using BPSK are coupled to the powerline through appropriate coupling mechanism 303.

The spread spectrum data received over the powerline is buffered by buffer 314 and then filtered by bandpass filter 313 prior to being mixed with a local oscillator signal using local oscillator 310 and mixer 305.

After mixing to shift the spectrum of the received signal the signal is then filtered by a low pass filter 309 and then digitized by A/D converted 306 before passing to the microcontroller which de-spreads the signal and decodes the message frames and timing reference from the aggregator. The same local oscillator is also used to drive a timer which is synchronized by SW to the time reference from the aggregator and used by SW to control the sampling of the despread data, and generation of transmit messages.

The microcontroller synchronizes to the aggregators framing signal and prepares appropriate reports of the appliance power consumption which is then encoded and spread using a phase shifted mSequence, this mSequence output is then mixed with the signal from the local oscillator and filtered by bandpass filter 312 before being passed to the powerline coupling circuit for transmission.

The aggregator shall transmit signals to the nodes using a bit stuffing protocol to enable insertion of frame sync symbol sequences into the communications channel.

The node shall receive the symbols and buffer then for processing, no symbols shall be processed until they have been verified as part of the communications according to the protocol rules.

A frame sync sequence shall consist of the symbol sequence 011110

A command frame header shall consist of the sequence 011111

Any sequence of three consecutive 1 symbols during a normal message shall be followed by a 0 symbol which shall be discarded by the node A command frame header shall always be preceded by a 0 which shall always be discarded, this ensures that a message sequence containing multiple 1 symbols shall always be distinguishable from a frame or command sync message.

When a message is completed and there is no more data to transmit the aggregator shall transmit a continuous sequence of 0 symbols to ensure that the frame sync can be correctly distinguished.

When the aggregator wishes to send a command sync sequence that would overlap with a frame sync sequence the aggregator shall always delay the transmission of the command sync sequence until the frame sync has been transmitted correctly.

If the aggregator is sending a sequence of 111 during a normal message transmission immediately prior to sending the frame sync such that the full transmitted sequence of 1110 would overlap with the frame sync sequence, it shall transmit the 1110 sequence only if the 0 would be transmitted immediately prior to the first 1 symbol of the frame sync, otherwise the sequence shall be broken down into 2 parts and treated independently, in this way the bit stuffing of the zero may be avoided and the frame sync remains unambiguous.

When receiving symbols the node shall buffer the symbols and pass them to the application only after validation according to the above rules, this means that the node may pass multiple symbols to the application simultaneously.

When a command sync sequence is received by a node any partially received command shall be discarded and reception of a new command shall begin. This is summarized in Table 3. This algorithm can be implemented simply with a state machine using the encoding shown in Table 4 and the associated state diagram illustrated in FIG. 4. FIG. 4 illustrates the state transitions for receiving data from the aggregator, the indication above the horizontal line being the symbol received and below the lines being the symbols passed to the application.

TABLE 3

| State | Next State | Buffer | Received | Passed to App | Next Buffer | Action |
|---|---|---|---|---|---|---|
| 0 | 1 | Empty | 0 | | 0 | |
| 0 | 2 | Empty | 1 | | 1 | |
| 1 | 1 | 0 | 0 | 0 | 0 | |
| 1 | 3 | 0 | 1 | | 01 | |
| 2 | 1 | 1 | 0 | 1 | 0 | |
| 2 | 4 | 1 | 1 | | 11 | |
| 3 | 1 | 01 | 0 | 01 | 0 | |
| 3 | 5 | 01 | 1 | | 011 | |
| 4 | 1 | 11 | 0 | 11 | 0 | |
| 4 | 6 | 11 | 1 | | 111 | |
| 5 | 1 | 011 | 0 | 011 | 0 | |
| 5 | 7 | 011 | 1 | | 0111 | |
| 6 | 0 | 111 | 0 | 111 | Empty | |
| 6 | 8 | 111 | 1 | | 1111 | |
| 7 | 0 | 0111 | 0 | 0111 | Empty | |
| 7 | 8 | 0111 | 1 | | 1111 | |
| 8 | 0 | 1111 | 0 | | Empty | Frame sync |
| 8 | 0 | 1111 | 1 | | Empty | Command start |

TABLE 4

| Buffer | State |
|---|---|
| Empty | 0 |
| 0 | 1 |
| 1 | 2 |
| 01 | 3 |
| 11 | 4 |
| 011 | 5 |
| 111 | 6 |
| 0111 | 7 |
| 1111 | 8 |

Figure 5:
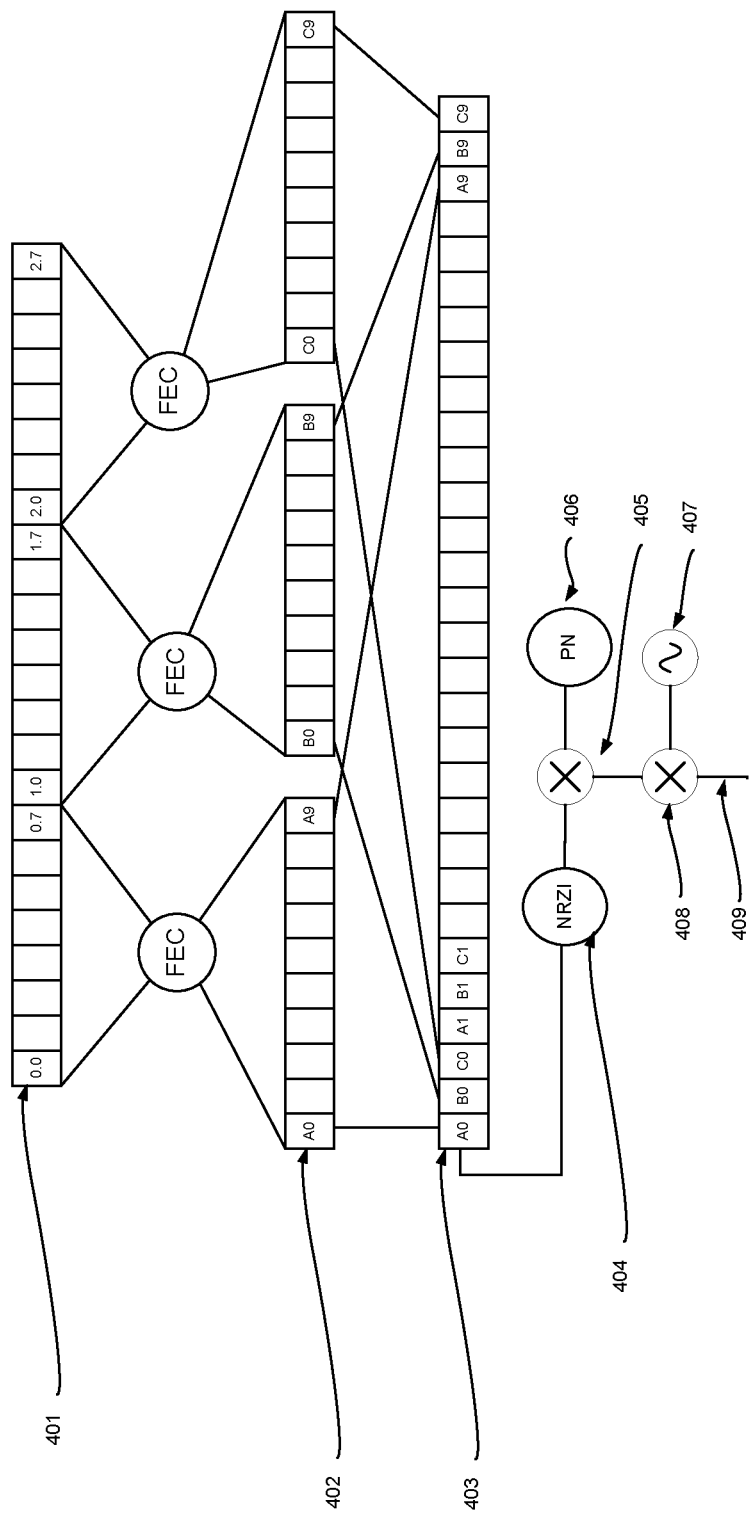
FIG. 5 illustrates the formatting and transmission of a data-frame according to an embodiment.

FIG. 5 illustrates the encoding of the message. The example shown is for a 24 bit message (401).

The data is first split into blocks of 11 bits for transmission, these are then replaced with FEC sequence of 15 bits (402) such that single bit errors may be corrected.

The blocks are then interleaved by taking one bit from each of the blocks sequentially to form a new bit sequence (403).

This new interleaved bit sequence is then NRZi encoded (404) and multiplied by the output of the m-sequence generator (406) using multiplier (405).

This combined signal is then multiplied using multiplier (408) by a carrier generated by oscillator (407) to produce a BPSK modulated the signal for transmission (409)

For maximum message integrity the number of blocks encoded is a function of the message length which is fixed for each message type, interleaving shall always take bit( ) from each interleaved block in order such that for a 3 byte message the sequence would be 0.0, 1.0, 2.0, 1, 1, 2.1, 3.1 . . . 0.9, 1.9.2.9 etc where the first digit represents the FEC encode block and the second digit represents the bit.

The aggregator shall split time into frames sufficient to allow all configured nodes to transmit their information to the aggregator.

Each frame shall be sub-divided into blocks of n symbols sufficiently long for a node to transmit one complete power consumption message.

Each node shall be allocated a time slot relative to the frame marker which determines when it is allowed to transmit, end the node shall maintain synchronization to the frame synch to ensure it does not interfere with other nodes.

Each node shall be allocated both a time slot and a code phase for transmission, this alleviates the need for address information since each node is uniquely identifiable by the aggregator.

At initialization a node shall have no transmit authorization and may only transmit in slot 0 at phase offset 0, it shall send a message repeatedly to the aggregator in this slot, using a random backoff mechanism and re-trying transmission until it receives an authorization from the aggregator to use another time slot and code phase offset, once this is configured it shall remember this information when power is removed and shall continue to use this information to transmit to the aggregator when powered on again.

The aggregator shall periodically send a message map indicating which channels it has received from since the previous message map was transmitted, if a node has been transmitting to the aggregator and was not in this message map it shall request a new authorization from the aggregator.

A node can at any time attempt to gain a new authorization from the aggregator by sending a request in slot 0 code phase offset 0, if the aggregator receives such request it shall allocate a new authorization to the node and remove any previous authorization.

This mechanism requires that each node have a unique means of identification, however after manufacture a node may not be unique, if a node does not have a unique identification number it shall request a number be generated by the aggregator which shall ensure that all identifiers are unique within a system, once allocated a unique identification the node shall remember this and use it in all subsequent messages where it is required.

The basic messages defined are
    Request time slot with ID
    Request Time Slot without ID
    Grant time slot
    Grant time slot and ID
    Turn On ID
    Turn Off ID
    Message Map
    Authenticate Operation (The authenticate operation message is a future security feature whereby a node may be locked to only operate in the presence of an aggregator).

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the monitoring device also acts as a control device. In this way the communication between the monitoring device and master can be a two way protocol. In such an embodiment, the monitoring device can receive a signal embedded in the timing signal from the aggregator which is a "turn off" or "turn on" command message. In response to this command, the monitoring device will switch-off or switch-on the attached appliance, as appropriate. This can be done by the microcontroller 307 switching the relay 304, to supply or disconnect power to the appliance (assuming the appliance is connected to the mains through the monitoring device, as shown in FIG. 3). Alternatively, the monitoring device may control the appliance via some other communication channel, such as a Bluetooth® wireless connection. This may be beneficial, for example, where the device has a shutdown protocol that should be completed before power is disconnected.

The aggregator may be adapted to communicate with a wide range of other devices and/or services. The aggregator could send the data it collects via an internet connection (such as ADSL) or a Smart Meter protocol which also uses power-line communications. For example, the data could be sent via Ethernet; USB; or WLAN to an ADSL modem line out of the building. Alternatively, the data could be sent via Zigbee to an installed smart meter and then out of the building. The data can be used by an energy supplier for smart metering and/or smart grid applications. The building owner could also use the data to analyse historical consumption or to remotely control overall power usage or individual appliances.

In the embodiments described earlier above, it is assumed that the master-aggregator and monitoring-nodes transmit signals in the same frequency band, using code-division and/or time-division techniques to avoid interference. However, in some embodiments, this may not suppress the effects of interference sufficiently. In particular, nodes and an aggregator transmitting in the same frequency band may experience a "near-far" problem which means that the desired far-end spread spectrum signal cannot be received, because of the relatively higher power of the near-end signal. This can occur because the cross-correlation between the different spreading codes used will always be non-zero, in practice. In this case, it may be preferable for the aggregator to transmit using a different frequency band from the nodes, thereby ensuring that the near-end interference is out-of-band and can be controlled by band-pass filtering.

The following possible uses of the power-consumption measurements and/or the monitoring and control network are envisaged:

1) A homeowner can see their detailed power consumption at a disaggregated level via a web site. That is, the measurements by individual monitoring devices for individual appliances can be inspected through a web interface.

2) A homeowner can see comparative data from other (preferably anonymous) customers with similar appliances to compare usage. This could be used as an incentive for users to compete to reduce energy consumption. It may also help the user to identify appliances that are relatively inefficient, compared to others.

3) A service provider or a utility supplier can send a periodic (for example, weekly or monthly) consumption report detailing a usage profile for the week/month; trends; and breakdowns, including hints and tips for reducing usage.

4) A utility supplier can remotely control selected appliances in the home (for example, turning off the fridge for 5 mins at peak time (5 pm-10 pm) three times a week) as part of a "green saver" tariff (which may offer a discount below the standard tariff).

5) The homeowner can remotely control all of their appliances via web or smartphone.

6) The homeowner can use an Auto Home Management (AHM) feature called a "standby saver" system. Individual appliance data will be analysed by the service provider (preferably using an automated algorithm) to determine if any power is being drawn when the device is in standby mode. Once it has been determined that standby-power is being drawn, the historical usage pattern will be analysed, to discover the typical period when the device is on standby. The system will then automatically set a corresponding power saver period, during which the appliance is turned off, or its power supply simply disconnected. For example a stack consisting of a TV/DVD/Set-top box (STB) may be switched off between 1 am and 6 am because they are found to draw 25 W in standby-power and the usage history suggests that these appliances have never been used later than 12 pm or earlier than 7 am.

7) The homeowner can use an AHM feature called power saver, in which devices with a continual or continuous power usage such as the fridge or freezer are cycled on an off through a period of known low activity.

8) A text service from the service provider whereby the homeowner can be alerted to excess consumption, or unusual or unpermitted use of appliances.

Obviously, although these usage scenarios and automation methods refer to "homes" and "homeowners", they may be equally applicable to commercial premises.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A power-consumption monitoring device, for taking measurements of the power consumed by an appliance,
   the device being connectable to a mains electrical circuit and operable to transmit the measurements to a master device through the circuit,
   wherein the device is adapted to:
      receive a spread-spectrum timing-reference signal from the master device;
      detect a code-phase of the received reference signal; and
      transmit the measurements to the master device with a timing that is defined relative to the detected code-phase.

2. The power-consumption monitoring device according to claim 1, wherein the spread-spectrum reference signal is periodically modulated by a synchronisation symbol,
   the monitoring device being adapted to:
      determine a timing by detecting the synchronisation symbol.

3. The power-consumption monitoring device according to claim 1, comprising a time-domain correlator for detecting the code-phase.

4. The power-consumption monitoring device according to claim 1, wherein the monitoring device is adapted to transmit to the master device an upstream signal which comprises a spreading code modulated by a data message, the data message including the power measurements,
   a transmit time-interval in which the upstream signal is transmitted and/or a transmit code-phase of the spreading code being defined relative to the detected code-phase of the reference signal.

5. The power-consumption monitoring device according to claim 4, wherein the monitoring device has:
   a configuration mode, in which it is adapted to:
      transmit the upstream signal using a first, predetermined time interval and/or code-phase reserved for negotiation with the master device; and
      receive, from the master device, configuration information assigning a second, different time interval and/or code-phase, and
   a normal mode in which it is adapted to:
      transmit the upstream signal using the assigned, second time interval and/or code-phase.

6. The power consumption monitoring device according to claim 4, wherein the device is adapted to transmit the upstream signal in a frequency band that is different from the frequency band of the spread-spectrum timing-reference signal received from the master device.

7. The power-consumption monitoring device according to claim 1, wherein the device is further adapted:
   to measure the energy consumed by the appliance in each of a series of e intervals, and maintain a first cumulative sum of the resulting energy measurements;
   to periodically transmit, to the master device, a first quantised value representing the cumulative sum; and
   to subtract the transmitted quantised value from the cumulative sum.

8. The power-consumption monitoring device of claim 7, wherein the quantisation used to generate the first quantised value is non-uniform, most preferably floating point quantisation.

9. A master device, for receiving over a mains electrical circuit power-measurements transmitted by one or more power-consumption monitoring devices,
   the master device being adapted to generate and transmit a spread-spectrum timing-reference signal through the mains electrical circuit to the one or more monitoring devices,
   the device being further adapted to receive the power-measurements from each of the one or more monitoring devices with a predetermined timing that is defined relative to a code-phase of the transmitted timing-reference signal.

10. The master device according to claim 9, wherein the device is adapted to receive from each of the one or more monitoring devices an upstream signal which comprises a spreading code modulated by a data message, the data message including the power measurements,
   the master device being further adapted to identify each individual monitoring device by the timing of reception of its upstream signal and/or the code-phase of the spreading code in the upstream signal.

11. The master device according to claim 10, wherein the device is adapted to transmit the spread-spectrum timing-reference signal in a frequency band that is different from a frequency band in which the upstream signals are received.

12. The master device according to claim 9, comprising a frequency-domain correlator for detecting the code-phase of the upstream signal from each of the one or more monitoring devices.

13. A power-line communications network comprising:
a master device for receiving over a mains electrical circuit power-measurements transmitted by one or more power-consumption monitoring devices, the master device being adapted to generate and transmit a spread-spectrum timing-reference signal through the mains electrical circuit to the one or more monitoring devices, the master device being further adapted to receive the power-measurements from each of the one or more monitoring devices with a predetermined timing that is defined relative to the code-phase of the transmitted timing-reference signal; and a power-consumption monitoring device, for taking measurements of the power consumed by an appliance, the monitoring device being connectable to a mains electrical circuit and operable to transmit the measurements to the master device through the circuit, wherein the monitoring device is adapted to:
receive a spread-spectrum timing-reference signal from the master device;
detect a code-phase of the received reference signal; and
transmit the measurements to the master device with a timing that is defined relative to the detected code-phase.

14. The power-line communication network of claim 13 wherein the network comprises a plurality of power-consumption monitoring devices.

* * * * *